(12) United States Patent
Liang

(10) Patent No.: US 7,595,667 B2
(45) Date of Patent: Sep. 29, 2009

(54) DRIVE CIRCUIT

(75) Inventor: Xiaoguang Liang, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 179 days.

(21) Appl. No.: 11/554,158

(22) Filed: Oct. 30, 2006

(65) Prior Publication Data

US 2007/0284689 A1 Dec. 13, 2007

(30) Foreign Application Priority Data

Jun. 9, 2006 (JP) ............................. 2006-160914

(51) Int. Cl.
*H03B 1/00* (2006.01)
(52) U.S. Cl. .................................................... 327/108
(58) Field of Classification Search ................. 327/108, 327/109, 111, 112
See application file for complete search history.

(56) References Cited

U.S. PATENT DOCUMENTS 6,734,706 B2 * 5/2004 Yoshida et al. .............. 327/108

6,774,674 B2    8/2004 Okamoto et al.

FOREIGN PATENT DOCUMENTS

| DE | 100 26 622 A1 | 6/2001 |
| JP | 2001-145370 | 5/2001 |
| JP | 2003-101391 | 4/2003 |
| JP | 2003-133927 | 5/2003 |
| JP | 2003-273715 | 9/2003 |

* cited by examiner

*Primary Examiner*—Jeffrey S Zweizig
(74) *Attorney, Agent, or Firm*—Oblon, Spivak, McClelland, Maier & Neustadt, P.C.

(57) ABSTRACT

A drive circuit has a level shift circuit which outputs level-shifted on and off signals each for controlling a power semiconductor element in an on or off state, a first RS flip flop which is supplied with the on signal through a setting input terminal and supplied with the off signal through a resetting input terminal, and which outputs a drive signal to the power semiconductor element, and a logic filter circuit which is provided between the level shift circuit and the first RS flip flop, and which blocks transmission of the on and off signals during the time period from a time at which both the on and off signals become a first logic to a time at which both the on and off signal become a second logic.

6 Claims, 8 Drawing Sheets

DRIVE CIRCUIT

BACKGROUND OF THE INVENTION

1. Field of the Invention The present invention relates to a drive circuit for driving a power semiconductor element and, more particularly to a drive circuit capable of avoiding a malfunction by removing asynchronous error signals as well as synchronous error signals.

2. Background Art

In ordinary cases of driving a half-bridge-connected power semiconductor element (MOSFET, IGBT or the like) with a high-withstand-voltage integrated circuit (HVIC), the load on the power semiconductor element is an inductive load (L) such as a motor or a fluorescent lamp. A transient change in high-side reference voltage ($V_S$) on the HVIC to the negative side with respect to ground (GND) occurs at the time of switching under the influence of this inductive load and a parasitic L component or the like due to wiring on a printed circuit board or the like. At the time of return from the change to the negative (voltage) side, a recovery current flows from the high-side power supply ($V_B$) through a level shift resistor as a drain current in the level-shifting high-withstand-voltage MOSFET. There is a possibility of this current being erroneously recognized as a high-side input signal to cause a malfunction of the high-side circuit and an abnormal signal output in the output (upper arm control signal) from the high-side circuit. A fault such as an arm short circuit may result in such a case. In some case, such a malfunction occurs due to dv/dt applied to Vs (see, for example, Japanese Patent Laid-Open No. 2003-133927).

To avoid this fault, a system in which a level shift signal is selected by means of a CR filter and a logic filtering system in which simultaneous input of error signals to an "RS flip flop" incorporated in the high-side circuit is excluded by a logic circuit (see for example, Japanese Patent Laid-Open No. 2001-145370).

A difference in malfunctioning signal margin exists between an element constituting the level shift circuit on the on-signal side and an element constituting the level shift circuit on the off-signal side due to manufacturing variation. Also, if the time period during which a recovery current due to negative noise in $V_S$ flows and the time period during which the off signal is generated overlap each other, the duration of the recovery current flowing through the level-shifting high-withstand-voltage MOSFET on the on side is longer than that of the recovery current flowing on the off side. In such a case, error signals not synchronous with each other (hereinafter referred to as asynchronous error signals) are generated in which the rise or fall times at which the on and off signals rise (from "L" to "H") or fall (from "H" to "L") do not coincide with each other or noncoincidence occurs both between the rise times and between the fall times. The conventional circuit, however, is capable of removing error signals generated on the on-signal side and the off-signal side simultaneously with each other and coinciding with each other in rise and fall times (hereinafter referred as synchronous error signals) but incapable of removing asynchronous error signals.

SUMMARY OF THE INVENTION

In view of the above-described problem, an object of the present invention is to provide a drive circuit capable of avoiding a malfunction by removing asynchronous error signals as well as synchronous error signals.

According to one aspect of the present invention, a drive circuit has a level shift circuit which outputs level-shifted on and off signals each for controlling a power semiconductor element in an on or of f state, a first RS flip flop which is supplied with the on signal through a setting input terminal and supplied with the off signal through a resetting input terminal, and which outputs a drive signal to the power semiconductor element, and a logic filter circuit which is provided between the level shift circuit and the first RS flip flops and which blocks transmission of the on and off signals during the time period from a time at which both the on and off signals become a first logic to a time at which both the on and off signal become a second logic.

According to the present invention, a malfunction can be avoided by removing asynchronous error signals as well as synchronous error signals.

Other and further objects, features and advantages of the invention will appear more fully from the following description.

DETAILED DESCRIPTION OF THE PREFERRED EMBODIMENTS

First Embodiment

Figure 1:
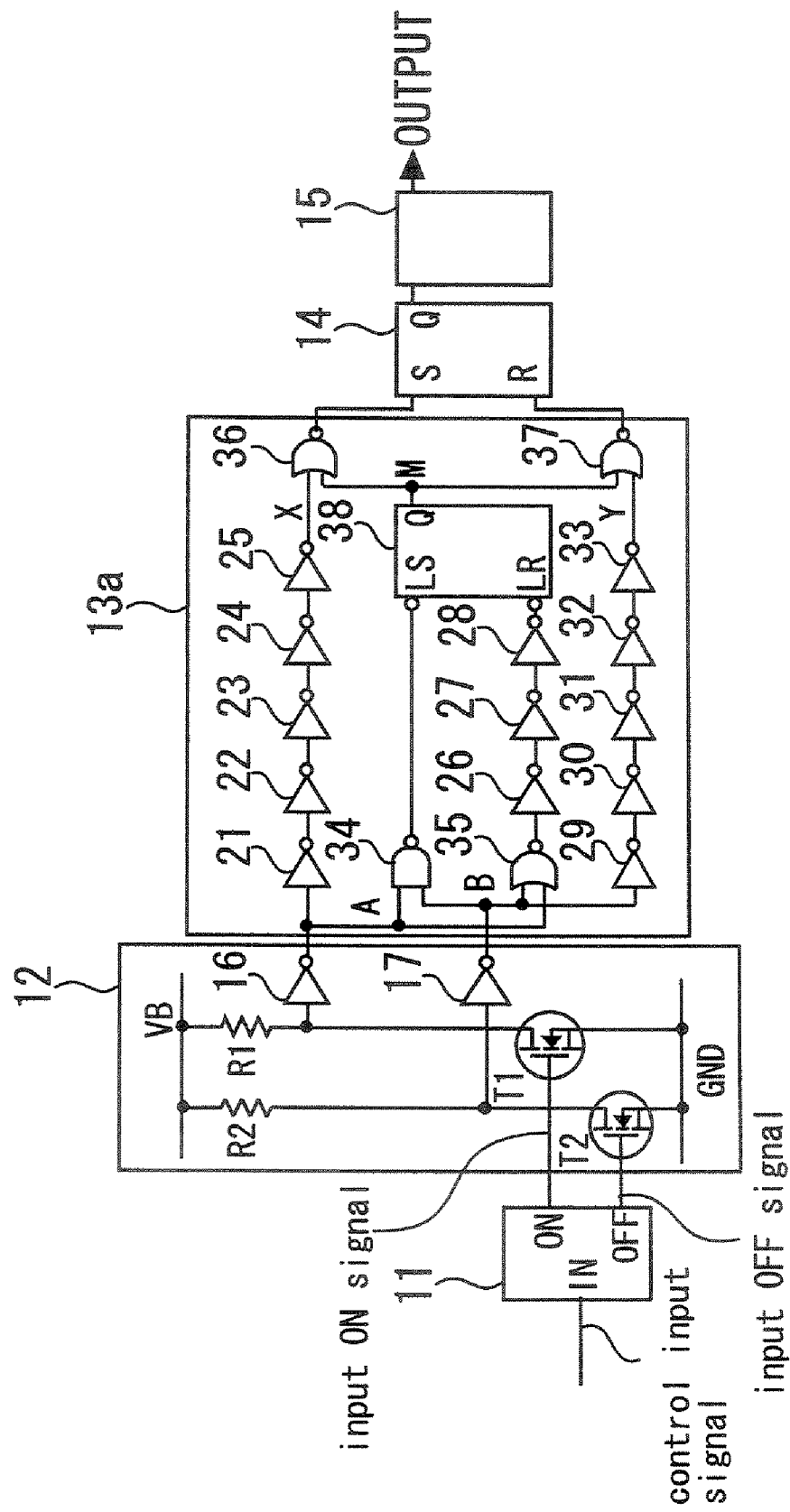
FIG. 1 is a diagram showing a drive circuit according the first embodiment of the present invention.
Figure 2:
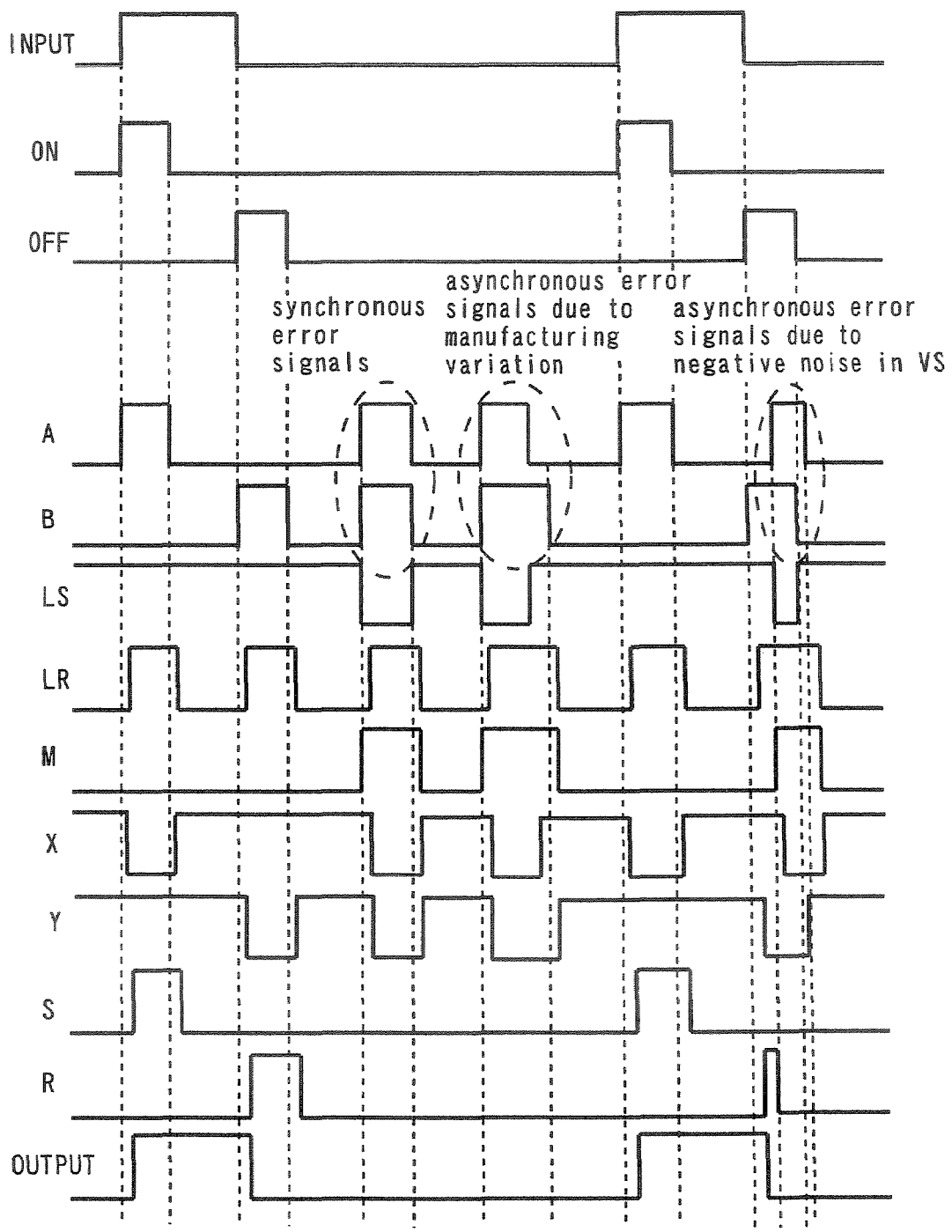
FIG. 2 is a timing chart for explaining the operation of the drive circuit shown in FIG. 1.

FIG. 1 is a diagram showing a drive circuit according the first embodiment of the present invention. FIG. 2 is a timing chart for explaining the operation of the drive circuit shown in FIG. 1.

This drive circuit generates a drive signal for a high-side power semiconductor element in a half bridge connection, and has a control pulse generation circuit 11, a level shift circuit 12, a logic filter 13a, an RS flip flop 14 and a driver circuit 15.

The control pulse generation circuit 11 receives a control input signal for controlling the high-side power semiconductor element, generates a one-shot pulse signal based on (synchronized with) a rise and fall of the control input signal and outputs separate input on and off signals of a low voltage (5 V) to the level shift circuit 12.

The level shift circuit 12 has resistors R1 and R2, high-withstand-voltage NMOS transistors Ta and T2, and inverters 16 and 17. The sources of the transistors T1 and T2 are connected to ground (GND), while the drains are connected to a high-side power supply ($V_B$) via the resistors R1 and R2, respectively. The low-voltage input on and input off signals for controlling the on/off operation of the power semiconductor element are applied from the control pulse generation circuit 11 to the gates of the transistors T1 and T2 on the basis of the control signal input to the control pulse generation circuit 11. The transistors T1 and T2 are operated by these signals to generate voltages across the resistors R1 and R2. The input on signal and the input off signal are thereby level-shifted to a high voltage (15 V) and output as an on signal (point A) and an off signal (point B) from the drain sides of the transistors T1 and T2 through inverters 16 and 17.

The RS flip flop 14 is supplied with on and off signals obtained through the logic filter circuit 13a described below in detail. The on signal is input through a setting input terminal S, while the on signal is input through a resetting input terminal R. The RS flip flop 14 outputs a drive signal to the gate terminal of the power semiconductor element (not shown) through the driver circuit 15. More specifically, the RS flip flop 14 sets output Q from "L" to "H" when the signal on the setting input terminal S changes from "L" to "H", and resets output Q from "H" to "L" when the signal on the resetting input terminal R changes from "L" to "H" in the state where output Q is "H".

The logic filter circuit 13 is provided between the level shift circuit 12 and the RS flip flop 14, and has inverters 21 to 33, a NAND circuit 34, NOR circuits 35 to 37, and a second RS flip flop 38. The NAND circuit 34 is supplied with the on and off signals level-shifted by the level shift circuit 12 and performs a NAND operation on these signals. The NOR circuit 35 is supplied with the on and off signals and performs a NOR operation on these signals.

The second RS flip flop 38 is supplied with an output signal from the NAND circuit 34. This signal is input through a setting input terminal LS. The second RS flip flop 38 is supplied with an output signal from the NOR circuit 35 through the inverters 26, 27, and 28. This signal is input through a resetting input terminal LR. The second RS flip flop 38 outputs a mask signal (point M) as output Q. The second RS flip flop 38 is of a negative logic input setting priority type such as to set the mask signal (point M) from "L" to "H" when the signal on the setting input terminal LS changes from "H" (first logic) to "L" (second logic), and reset the mask signal from "H" to "L" when the resetting input LR changes from "H" to "L" in the state where the mask signal is "H".

The NOR circuit 36 is supplied with the on signal through the inverters 21 to 25 and with the mask signal from the second RS flip flop 38, performs a NOR operation and outputs the result of this operation to the setting input terminal S of the RS flip flop 14. The NOR circuit 37 is supplied with the off signal through the inverters 29 to 33 and with the mask signal from the second RS flip flop 38, performs a NOR operation and outputs the result of this operation to the resetting input terminal R of the RS flip flop 14.

As shown in FIG. 2 not only synchronous error signals but also asynchronous error signals due to manufacturing variation and asynchronous error signals due to negative noise in Vs are generated on the on signal (point A) and the off signal (point B). However, the mask signal (point M) output from the second RS flip flop 38 is "H" during the time period from the time at which both the on and off signals become "H" to the time at which both the on and off signals become "L". The logic filter circuit 13a thereby blocks transmission of the on and off signals during the time period from the time at which both the on and off signals become "H" to the time at which both the on and off signals become "L". Thus, asynchronous error signals are removed as well as synchronous error signals to avoid malfunctioning. Since signal transmission delay time adjustment is performed by using the inverters, the drive circuit can be implemented with improved characteristics and high accuracy.

Timing charts including FIG. 2 are depicted as if error signals are successively generated on the on signal (point A) and the off signal (point B). However, the timing charts are provided to be conveniently used for concrete explanation the operation of the circuit in the embodiments and are not necessarily based on actual signal waveforms including error signals.

Second Embodiment

Figure 3:
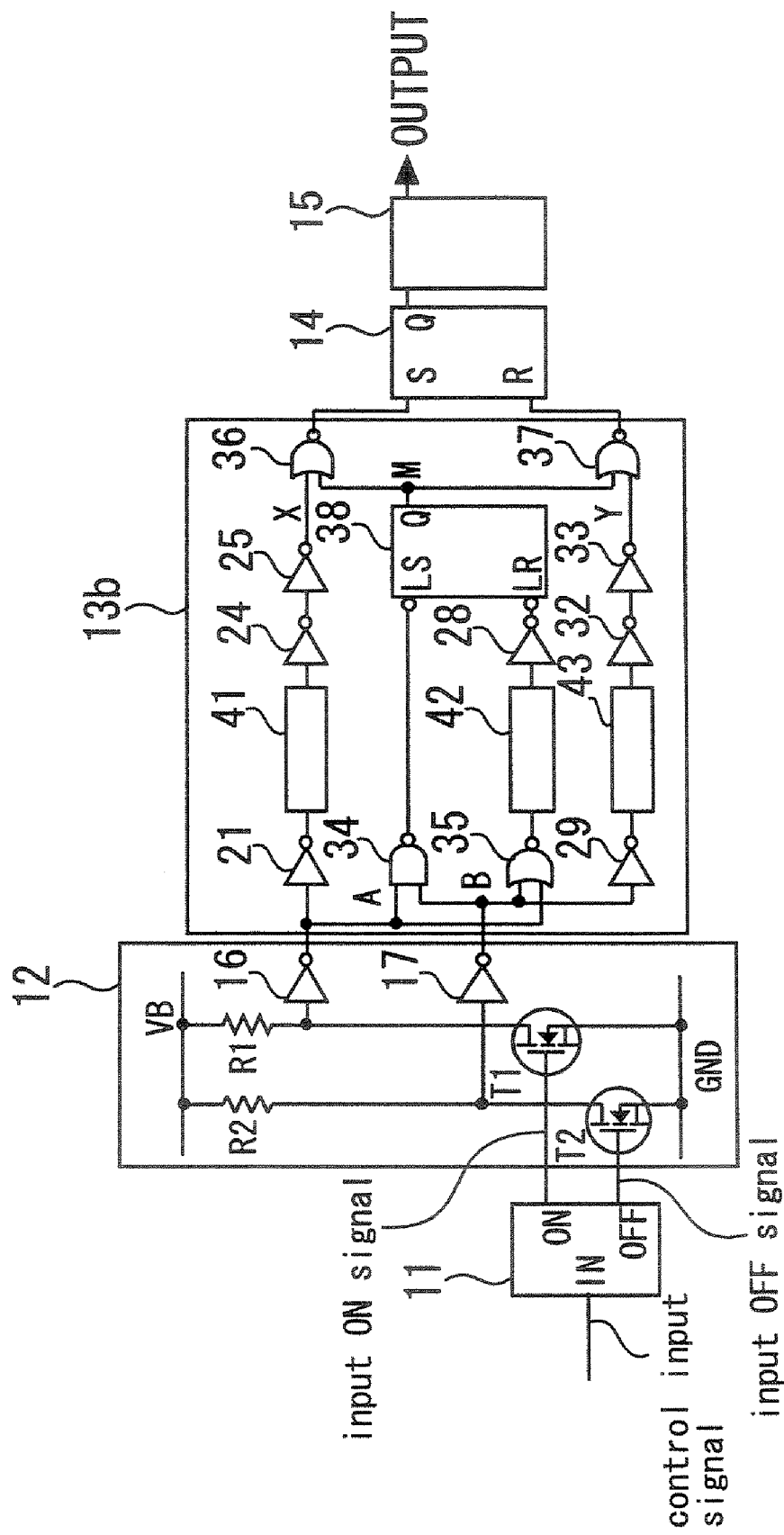
FIG. 3 is a diagram showing a drive circuit according the second embodiment of the present invention.
Figure 4:
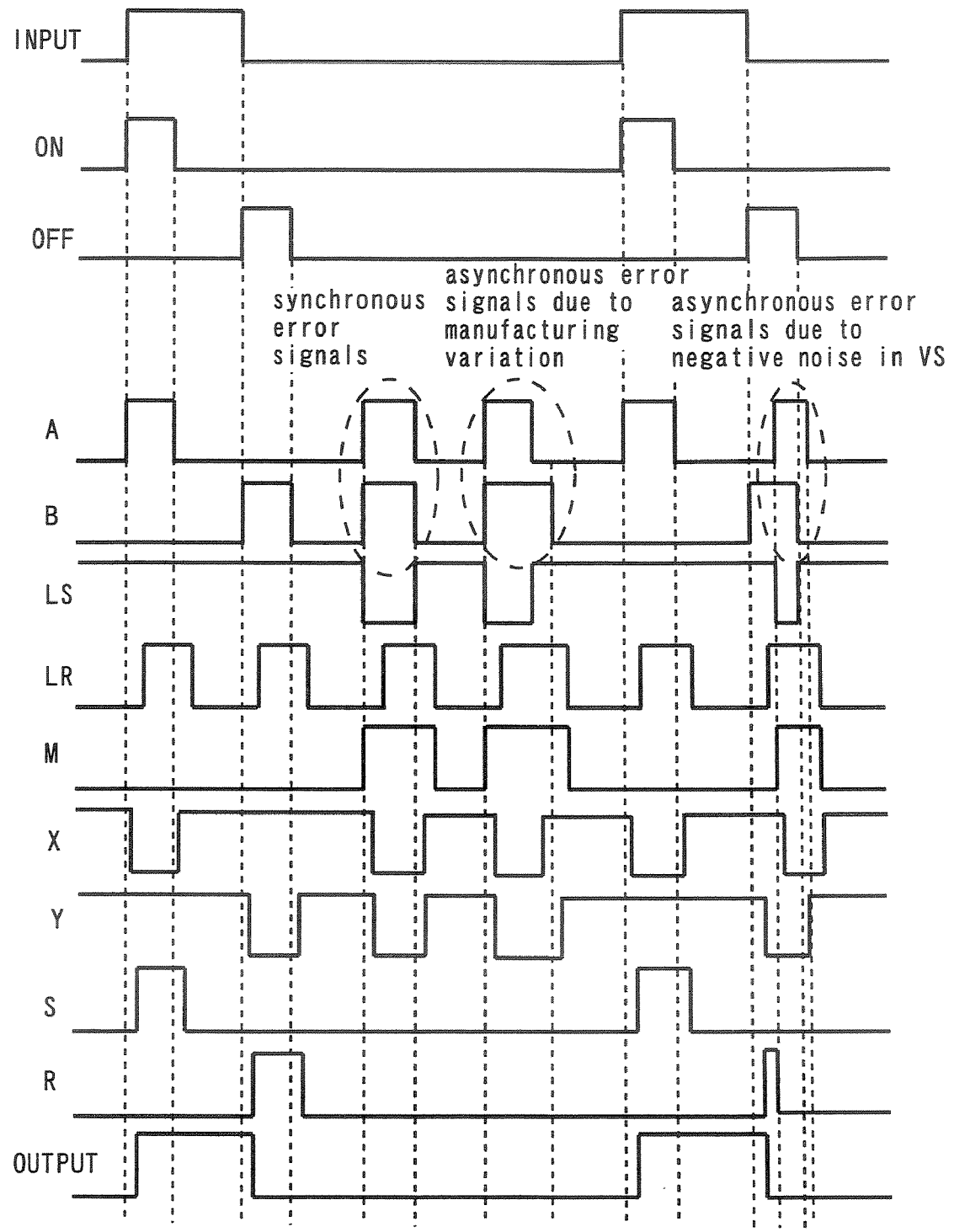
FIG. 4 is a timing chart for explaining the operation of the drive circuit shown in FIG. 3.

FIG. 3 is a diagram showing a drive circuit according the second embodiment of the present invention. FIG. 4 is a timing chart for explaining the operation of the drive circuit shown in FIG. 3.

In comparison with the first embodiment, a logic filter circuit 13b in this drive circuit has a delay circuit 42 provided between the NOR circuit 35 and the resetting input terminal LR of the second RS flip flop 38 in place of the inverters 26 and 27, a delay circuit 41 provided between the level shift circuit 12 and the NOR circuit 36 in place of the inverters 22 and 23, and a delay circuit 43 provided between the level shift circuit 12 and the NOT circuit 37. Ordinarily, each of these delay circuits 41, 42, and 43 is provided by connecting a capacitor between the signal line and a reference voltage and the delay time is adjusted on the basis of the charge/discharge characteristics of the delay circuit. The range of delay time can be freely set in comparison with the case of adjusting the delay time by connecting inverters in multiple stages.

As shown in FIG. 4, with respect to each of synchronous and asynchronous error signals generated on the on signal (point A) and the off signal (point B), the mask signal (point M) output from the second RS flip flop 38 is "H" during the time period from the time at which both the on and off signals become "H" to the time at which both the on and off signals become "L". The logic filter circuit 13b thereby blocks transmission of the on and off signals during the time period from the time at which both the on and off signals become "H" to the time at which both the on and off signals become "L". Thus, asynchronous error signals are removed as well as synchronous error signals to avoid malfunctioning. If a delay accompanying transmission of the on and off signals is longer than a delay accompanying the formation of the mask signal, error signals cannot be removed. Therefore, there is a need to set the delay time by the delay circuits 41 and 43 shorter than the delay time of the delay circuit 42. The same can also be said with respect to other embodiments having different circuit configurations. The circuit operation can be optimized by adjusting the settings of the pulse width and so on of the input on signal and the input off signal as well as the setting of the delay time.

The second embodiment represents a case where the delay time by the delay circuit 42 is set longer than the delay time by the inverters 26 and 27 in the first embodiment. The time period from the time at which the on signal (point A) or the off signal (point B) makes a transition to the time at which the signal on the resetting input terminal LR of the second RS flip flop 38 rises or falls in correspondence with the transition is increased. As a result, the time period during which the mask signal (point M) is "H" is increased in comparison with the first embodiment.

Thus, the range of blocking of transmission of the on and of f signals by adjusting the delay time of the delay circuit 42 can be controlled more easily in comparison with the first embodiment, while the same effect as that of the first embodiment is achieved.

Third Embodiment

Figure 5:
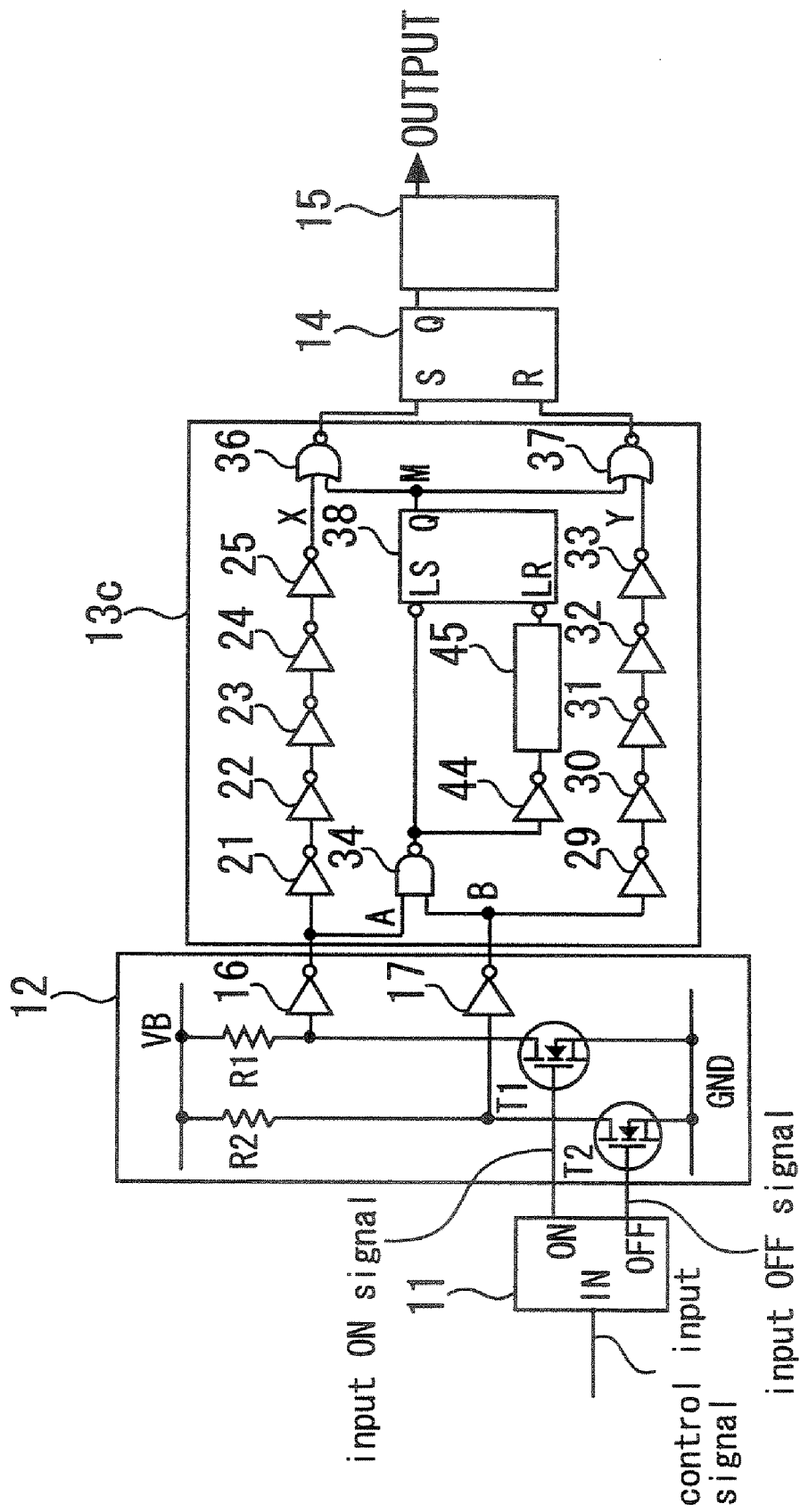
FIG. 5 is a diagram showing a drive circuit according the third embodiment of the present invention.
Figure 6:
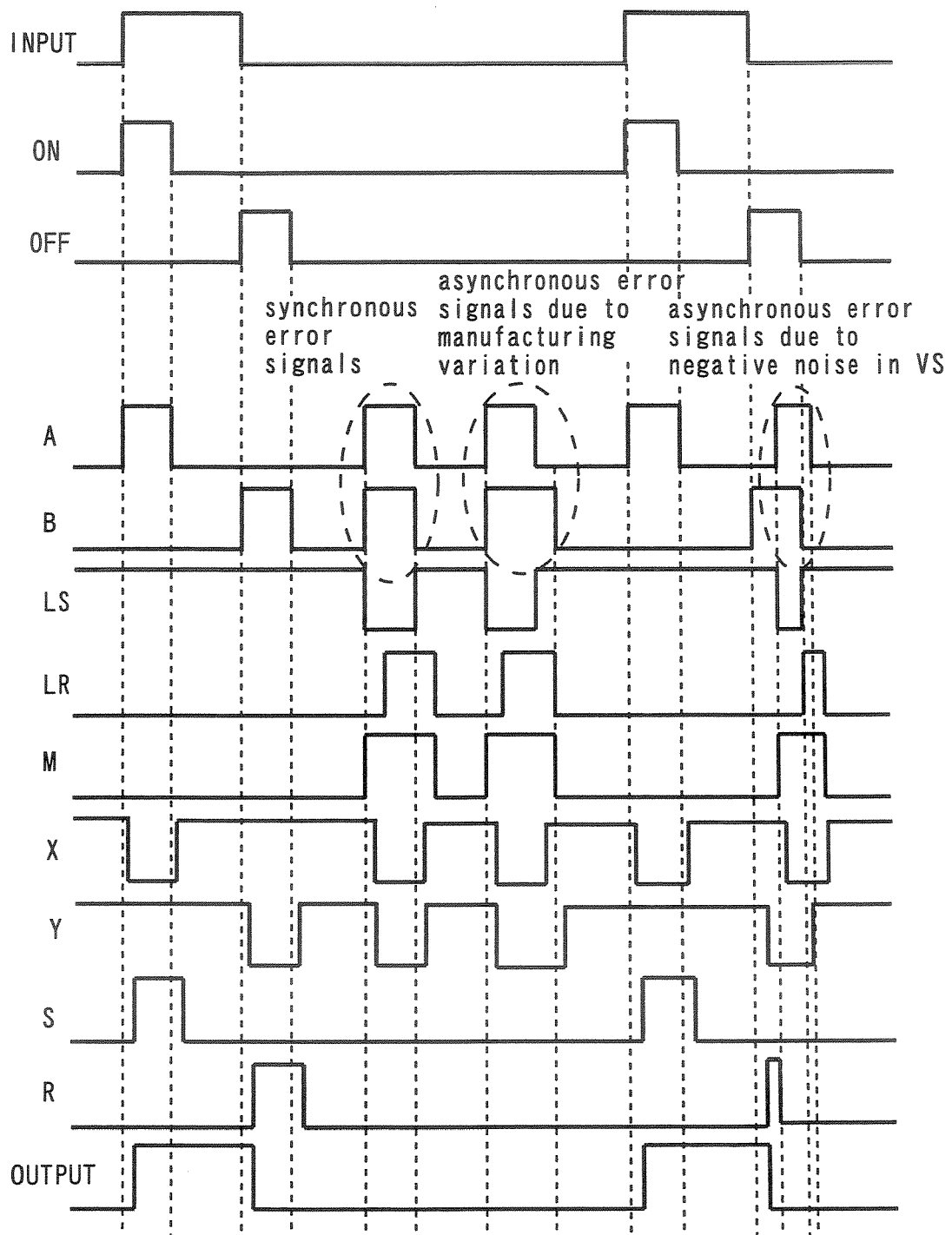
FIG. 6 is a timing chart for explaining the operation of the drive circuit shown in FIG. 5.

FIG. 5 is a diagram showing a drive circuit according the third embodiment of the present invention. FIG. 6 is a timing chart for explaining the operation of the drive circuit shown in FIG. 5.

In comparison with the first embodiment, a logic filter circuit 13c in this drive circuit has an inverter 44 and a delay circuit 45 provided between the NAND circuit 34 and the resetting input terminal LR of the second RS flip flop 38 in place of the NOR circuit 35 and the inverters 26 to 28.

The second RS flip flop 38 is supplied with the output signal from the NAND circuit 34 through the setting input terminal LS and with the signal obtained by inverting the output signal from the NAND circuit 34 through the resetting input terminal LR, and outputs the mask signal. More specifically, the second RS flip flop 38 sets the mask signal from "L" to "H" when the signal on the setting input terminal LS changes from "H" to "L", and resets the mask signal from "H" to "L" when the signal on the resetting input terminal LR changes from "H" to "L".

As shown in FIG. 6, with respect to each of synchronous and asynchronous error signals generated on the on signal (point A) and the off signal (point B), the mask signal (point M) output from the second RS flip flop 38 is "H" during the lapse of a predetermined delay time after the time at which both the on and off signals become "H". The logic filter circuit 13c is optimized with respect to the predetermined delay time to block transmission of the on and off signals during the time period from the time at which both the on and off signals become "H" to the time at which both the on and off signals become "L". Thus, asynchronous error signals are removed as well as synchronous error signals to avoid malfunctioning. A signal obtained by inverting and delaying the signal on the setting input terminal LS, as it were, is supplied to the resetting input terminal LR of the second RS flip flop 38, thus enabling the circuit configuration to be simplified.

Fourth Embodiment

Figure 7:
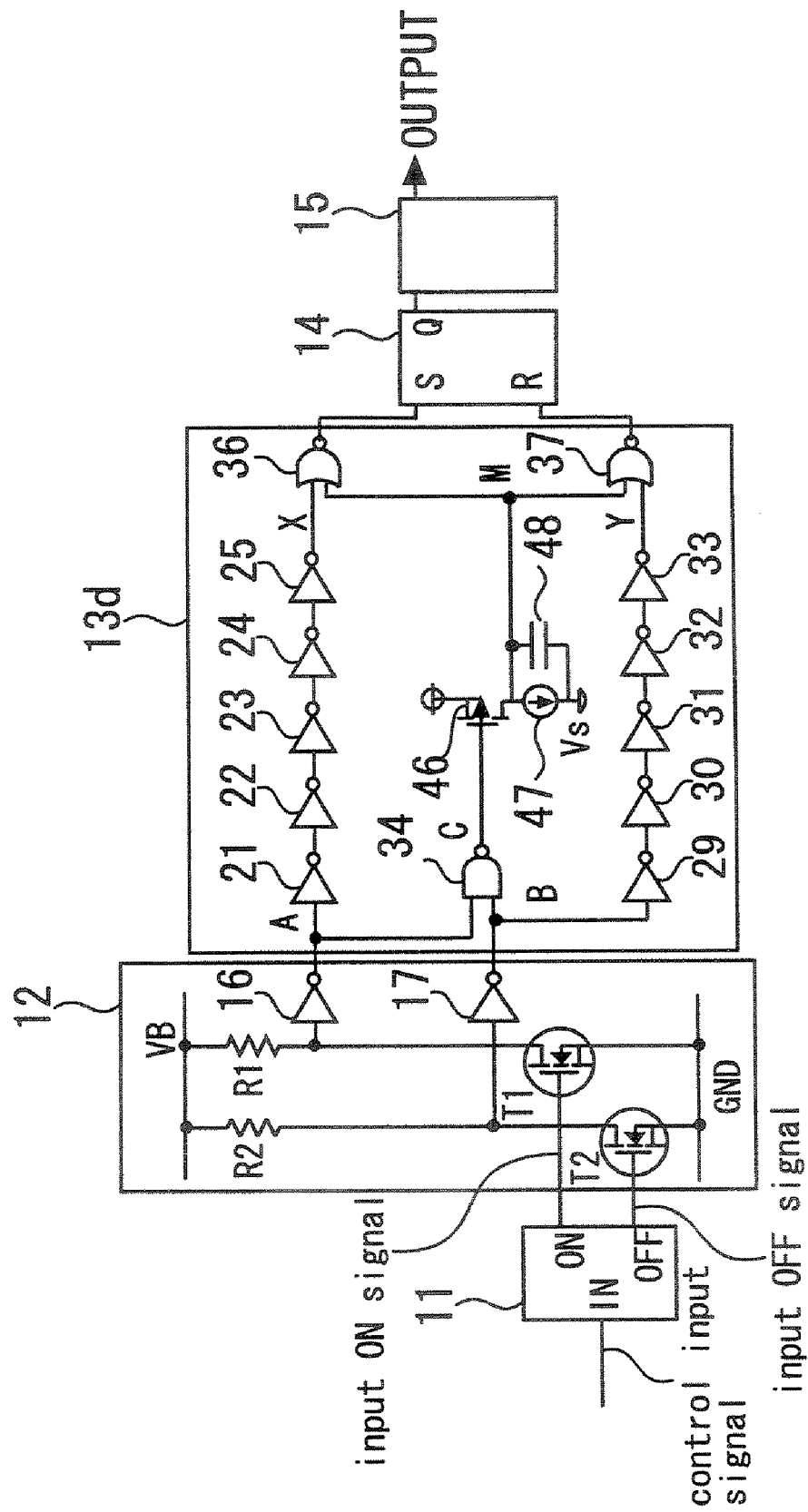
FIG. 7 is a diagram showing a drive circuit according the fourth embodiment of the present invention.
Figure 8:
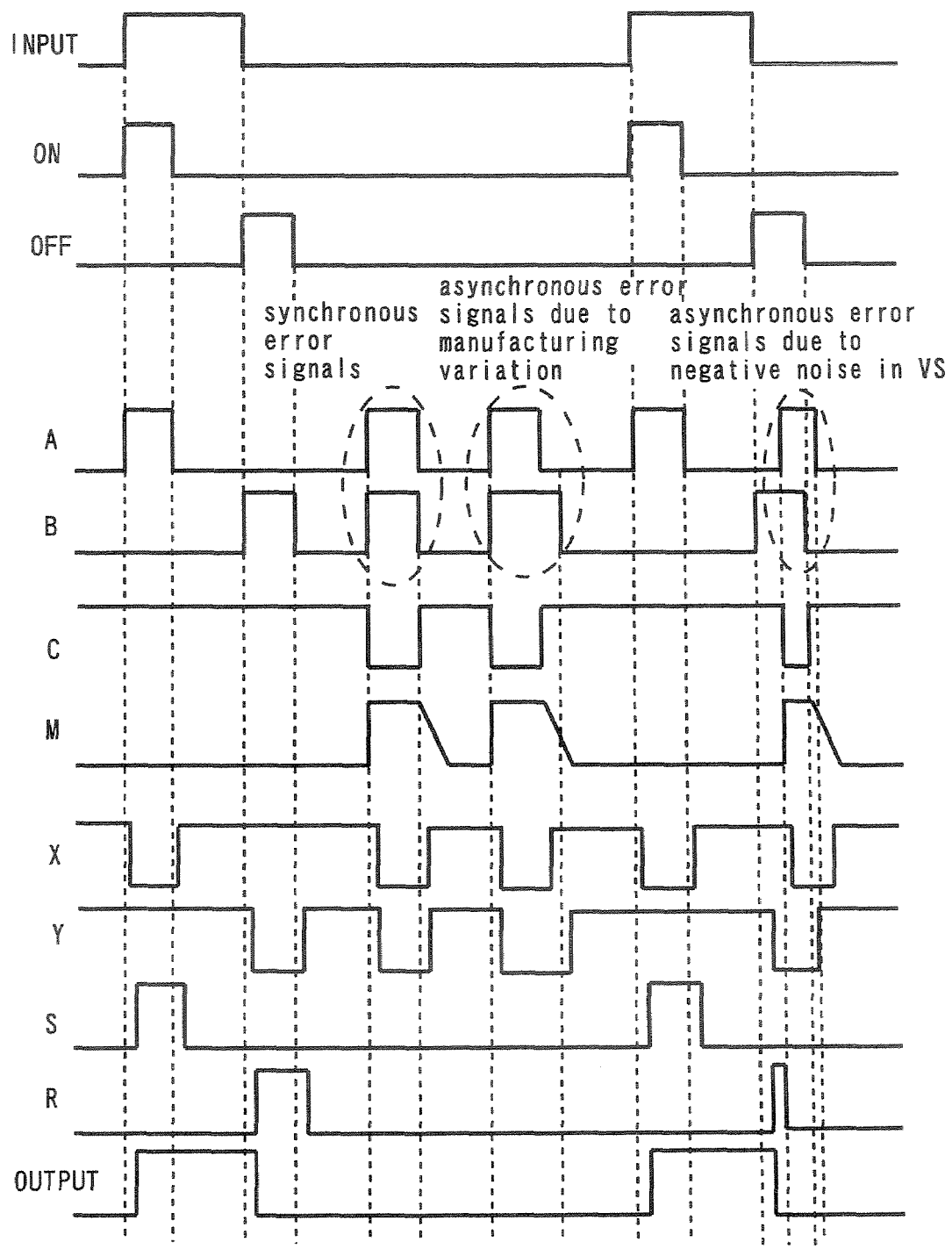
FIG. 8 is a timing chart for explaining the operation of the drive circuit shown in FIG. 7.

FIG. 7 is a diagram showing a drive circuit according the fourth embodiment of the present invention. FIG. 8 is a timing chart for explaining the operation of the drive circuit shown in FIG. 7.

In comparison with the first embodiment, a logic filter circuit 13d in this drive circuit has, in place of the NOR circuit 35, the inverters 26 to 28 and the second RS flip flop 38, a PMOS transistor 46 which has its gate connected to the output of the NAND circuit 34 and its source connected to high-side power supply ($V_B$), and which outputs a signal from its drain, a constant current circuit 47 connected between the drain of the PMOS transistor 46 and high-side reference voltage ($V_S$), and a capacitor 48 connected in parallel with the constant current circuit 47. The output signal at the drain of the PMOS transistor 46 is obtained as the mask signal (point M). The NOR circuit 36 is supplied with a signal obtained by inverting the on signal and the drain output signal from the PMOS transistor 46, i.e., the mask signal, and performs a NOR operation on these signals. The NOR circuit 37 is supplied with a signal obtained by inverting the off signal and the output signal from the PMOS transistor 46 and performs a NOR operation on these signals.

As shown in FIG. 8, with respect to each of synchronous and asynchronous error signals generated on the on signal (point A) and the off signal (point B), the PMOS transistor 46 is turned on to rapidly charge the capacitor 48 from the high-side power supply when both the on and off signals become "H", thereby setting the mask signal to "H" When one of the on and off signals becomes "L", the PMOS transistor 46 is turned off and the charge on the capacitor 48 is discharged by the constant current circuit 47. The mask signal is thereby reset to "L" after the lapse of a predetermined time period. The logic filter circuit 13d is optimized with respect to the predetermined time period to block transmission of the on and off signals during the time period from the time at which both the on and off signals become "H" to the time at which both the on and off signals become "L". Thus, asynchronous error signals are removed as well as synchronous error signals to avoid malfunctioning. The predetermined time period before setting to "L" can be determined through the capacitance of the capacitor 46 and the constant current of the constant current circuit 47. Therefore the desired value can be set as the predetermined time period with accuracy. In particular, in a case where a constant current circuit is provided together with a drive circuit in an IC configuration, the circuit according to the fourth embodiment can be easily configured by using the constant current circuit.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2006-160914 filed on Jun. 9, 2006 including specification, claims, drawings and summary, on which the Convention priority of the present application is based, are incorporated herein by reference in its entirety.

What is claimed is:

1. A drive circuit comprising:
  a level shift circuit which outputs level-shifted on and off signals each for controlling a power semiconductor element in an on or off state;
  a first RS flip flop which is supplied with the on signal through a setting input terminal and supplied with the off signal through a resetting input terminal, and which outputs a drive signal to the power semiconductor element; and
  a logic filter circuit which is provided between the level shift circuit and the first RS flip flop, the logic filter circuit including a second RS flip flop, different from the first RS flip flop, which outputs a mask signal which is used to block transmission of the on and off signals during the time period from a time at which both the on and off signals become a first logic to a time at which both the on and off signals become a second logic.

2. A drive circuit comprising:
  a level shift circuit which outputs level-shifted on and off signals each for controlling a power semiconductor element in an on or off state;
  a first RS flip flop which is supplied with the on signal through a setting input terminal and supplied with the off signal through a resetting input terminal, and which outputs a drive signal to the power semiconductor element; and
  a logic filter circuit which is provided between the level shift circuit and the first RS flip flop, and which blocks transmission of the on and off signals during the time period from a time at which both the on and off signals become a first logic to a time at which both the on and off signals become a second logic,
wherein the logic filter circuit comprises:
a NAND circuit which is supplied with the on and off signals, and which performs a NAND operation;
a first NOR circuit which is supplied with the on and off signals, and which performs a NOR operation;
a second RS flip flop which is supplied with an output signal from the NAND circuit through a setting input terminal and supplied with a signal obtained by inverting an output signal from the first NOR circuit through a resetting input terminal, and which outputs a mask signal;
a second NOR circuit which is supplied with a signal obtained by inverting the on signal and with the mask signal, and which performs a NOR operation; and
a third NOR circuit which is supplied with a signal obtained by inverting the off signal and with the mask signal, and which performs a NOR operation, and
wherein the second RS flip flop sets the mask signal from the second logic to the first logic when the signal input through the setting input terminal changes from the first logic to the second logic, and sets the mask signal to the first logic to the second logic when the signal input through the resetting input terminal changes from the first logic to the second logic.

3. The drive circuit according to claim 2, wherein the logic filter circuit has a delay circuit provided between the first NOR circuit and the resetting input terminal of the second RS flip flop.

4. A drive circuit comprising:
a level shift circuit which outputs level-shifted on and off signals each for controlling a power semiconductor element in an on or off state;
a first RS flip flop which is supplied with the on signal through a setting input terminal and supplied with the off signal through a resetting input terminal, and which outputs a drive signal to the power semiconductor element; and
a logic filter circuit which is provided between the level shift circuit and the first RS flip flop, and which blocks transmission of the on and off signals during the time period from a time at which both the on and off signals become a first logic to a time at which both the on and off signals become a second logic,
wherein the logic filter circuit comprises:
a NAND circuit which is supplied with the on and off signals, and which performs a NAND operation;
a second RS flip flop which is supplied with an output signal from the NAND circuit through a setting input terminal and supplied with a signal obtained by inverting an output signal from the NAND circuit through a resetting input terminal, and which outputs a mask signal;
a delay circuit provided between the NAND circuit and the resetting input terminal of the second RS flip flop;
a first NOR circuit which is supplied with a signal obtained by inverting the on signal and with the mask signal, and which performs a NOR operation;
a second NOR circuit which is supplied with a signal obtained by inverting the off signal and with the mask signal, and which performs a NOR operation, and
wherein the second RS flip flop sets the mask signal from the second logic to the first logic when the signal input through the setting input terminal changes from the first logic to the second logic, and sets the mask signal to the first logic to the second logic when the signal input through the resetting input terminal changes from the first logic to the second logic.

5. A drive circuit comprising:
a level shift circuit which outputs level-shifted on and off signals each for controlling a power semiconductor element in an on or off state;
a first RS flip flop which is supplied with the on signal through a setting input terminal and supplied with the off signal through a resetting input terminal, and which outputs a drive signal to the power semiconductor element; and
a logic filter circuit which is provided between the level shift circuit and the first RS flip flop, and which blocks transmission of the on and off signals during the time period from a time at which both the on and off signals become a first logic to a time at which both the on and off signals become a second logic,
wherein the logic filter circuit comprises:
a NAND circuit which is supplied with the on and off signals, and which performs a NAND operation;
a PMOS transistor which has its gate connected to an output of the NAND circuit and its source connected to a power supply, and which outputs a signal from its drain;
a constant current circuit connected between the drain of the PMOS transistor and a reference voltage;
a capacitor connected between the drain of the PMOS transistor and the reference voltage in parallel with the constant current circuit;
a first NOR circuit which is supplied with a signal obtained by inverting the on signal and with the output signal from the PMOS transistor, and which performs a NOR operation; and
a second NOR circuit which is supplied with a signal obtained by inverting the off signal and with the output signal from the PMOS transistor, and which performs a NOR operation.

6. A drive circuit comprising:
a level shift circuit which outputs level-shifted on and off signals each for controlling a power semiconductor element in an on or off state;
a first RS flip flop which is supplied with the on signal through a setting input terminal and supplied with the off signal through a resetting input terminal, and which outputs a drive signal to the power semiconductor element; and
a logic filter circuit which is provided between the level shift circuit and the first RS flip flop, and which blocks transmission of the on and off signals during the time period from a time at which both the on and off signals become a first logic, and continues blocking transmission of the on and off signals at a time at which only one of the on signal and the off signal becomes a second logic and the other signals remain on the first logic, and stop blocking transmission of the on and off signals at a time at which both the on and off signals become the second logic.

* * * * *